United States Patent [19]

Sugita et al.

[11] Patent Number: 5,332,013
[45] Date of Patent: Jul. 26, 1994

[54] UNMANNED CONVEYING DEVICE IN CLEAN ROOM

[75] Inventors: Masanao Sugita; Hitoshi Kawano; Teppei Yamashita, all of Ise, Japan

[73] Assignee: Shinko Electric Co., Ltd., Tokyo, Japan

[21] Appl. No.: 850,668

[22] Filed: Mar. 13, 1992

[51] Int. Cl.$^5$ .......................... H05K 3/00; B60L 11/00
[52] U.S. Cl. ................................. 141/98; 141/4; 141/197; 141/70; 141/85; 141/94; 141/231; 141/312; 141/346; 141/351; 141/367; 414/217; 422/40; 901/1; 191/4; 340/687; 320/2; 118/719
[58] Field of Search ............... 141/1, 4, 47, 48, 59, 141/67, 69, 70, 85, 89, 91–94, 197, 98, 231, 312, 346, 347, 367, 351–354, 360–362, 383, 386, 392, DIG. 2; 250/492.2–492.24, 441.11, 442.11; 222/152; 414/217, 221, 222, 225, 226; 901/1; 191/2–5, 7, 1 R; 180/167, 168; 137/551, 560, 614; 285/119; 118/719; 204/298, 2.5; 422/4, 9, 40; 320/2; 340/632, 636, 679, 686, 687; 364/424.01, 424.02

[56] References Cited

U.S. PATENT DOCUMENTS

| | | | |
|---|---|---|---|
| 3,239,360 | 3/1966 | Dixon | 422/40 X |
| 3,937,847 | 2/1976 | Elkins et al. | 422/40 X |
| 4,084,875 | 4/1978 | Yamamoto | 340/687 X |
| 4,641,693 | 2/1987 | Rakucewicz | 141/98 |
| 4,698,775 | 10/1987 | Koch et al. | 901/1 |
| 4,724,874 | 2/1988 | Parikh et al. | 141/98 |
| 4,780,817 | 10/1988 | Lofgren | 364/424.01 |
| 4,851,018 | 7/1989 | Lazzari et al. | 414/217 X |
| 4,948,979 | 8/1990 | Munakata et al. | 250/492.2 |
| 4,977,935 | 12/1990 | Durkee, Jr. et al. | 141/383 X |
| 5,137,063 | 8/1992 | Foster et al. | 141/98 |

FOREIGN PATENT DOCUMENTS

| | | | |
|---|---|---|---|
| 1728486 | 5/1973 | Fed. Rep. of Germany | 285/119 |
| 7160303 | 10/1982 | Japan | 320/2 |
| 2098596 | 4/1990 | Japan | 141/231 |

Primary Examiner—J. Casimer Jacyna
Attorney, Agent, or Firm—Flynn, Thiel, Boutell & Tanis

[57] ABSTRACT

An unmanned conveying device for a clean room is capable of restraining a spontaneous oxide film from growing in case that an unmanned carriage is obliged to stop for a long time due to its own cause of a cause at a destination spot while it conveys a semiconductor wafer from one spot to the destination spot. It is a first aspect of the invention to provide the unmanned conveying device which is self-propelled for conveying an object from a ground facility to a destination spot while loading an object to be conveyed thereon, characterized in that the object is accommodated in a container and the container is connected to an inert gas reservoir through a gas supply passage so that the atmosphere in the container can be replaced by a nitrogen gas. It is a second aspect of the invention to provide an unmanned conveying device for a clean room provided with a container for accommodating an object to be conveyed therein, the container being connected to an inert gas reservoir through a gas supply passage so that the air in the container can be replaced by a nitrogen gas, characterized in that the unmanned conveying device has a coupler unit mounted thereon and connected to the gas supply passage and the inert gas reserving source is located on the ground and connected to a coupler unit of a coupler device on the ground through a pipe and the gas supply passage is connected to the inert gas reservoir through both coupler unit.

10 Claims, 11 Drawing Sheets

UNMANNED CONVEYING DEVICE IN CLEAN ROOM

BACKGROUND OF THE INVENTION

1. Field of the Invention

The present invention relates to an unmanned conveying device to be used for conveying a semiconductor wafer or a substrate for use in an electronic device material.

2. Prior Art

A semiconductor integrated circuit is normally manufactured in a clean room where air is always cleansed. As the integration of the semiconductor progresses, there occurs the problem in that a spontaneous oxide film is formed on the surface of the semiconductor wafer or the substrate of the electronic device material. It is necessary to restrain the spontaneous oxide film from growing in view of improving the manufacturing yield.

Figure 14:
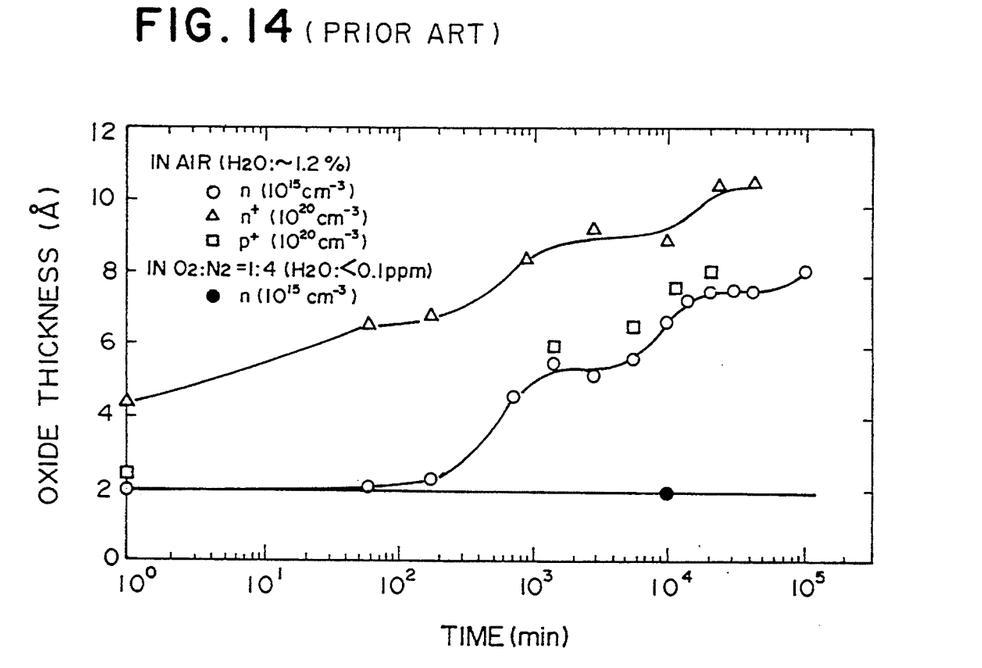
FIG. 14 is a view showing the relation between the thickness of and the time involved in a spontaneous oxide film of a silicon semiconductor wafer.
Figure 15:
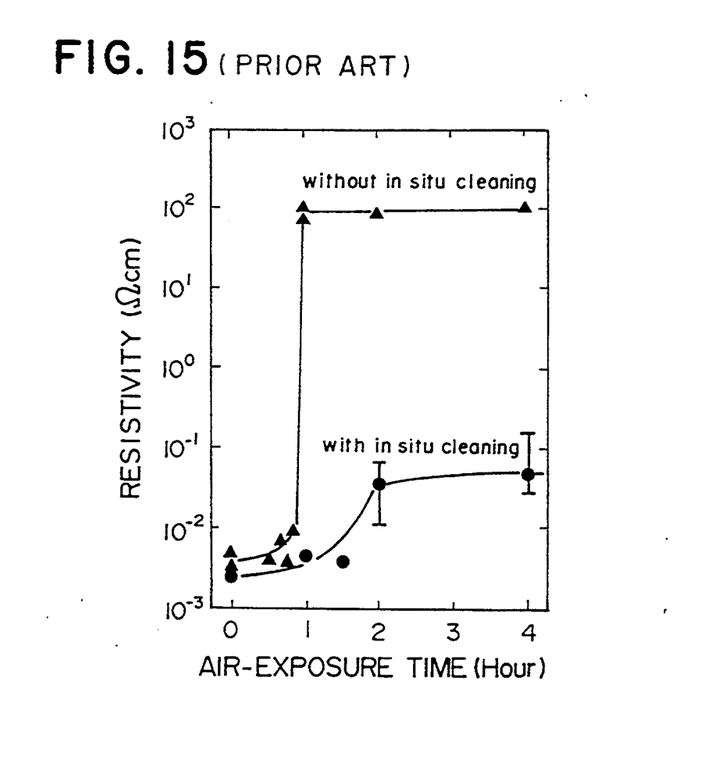
FIG. 15 is a view showing the relation between the resistivity of and the time involved in the spontaneous oxide film of the silicon semiconductor wafer.

FIGS. 14 and 15 are graphs disclosed in the "Super LSI ultra clean technology symposium" (Nov. 19, 1990), in which FIG. 14 shows a relation between a spontaneous oxide film thickness and time involved in forming the spontaneous oxide film on the surface of a silicon semiconductor wafer (Formed by oxygen and moisture in air) and FIG. 15 shows a relation between resistivity and time involved in forming the spontaneous oxide film. As evident from FIG. 14, when the silicon semiconductor wafer is exposed to the atmosphere, the growth rate of the oxide film is increased after the lapse of 100 to 200 minutes and the resistivity is sharply increased after the lapse of about one hour as illustrated in FIG. 15.

In the clean room, an unmanned carriage having a loading robot mounted thereon is used for conveying the semiconductor wafer from one spot where one manufacturing step is carried out to another spot where another manufacturing step is carried out. The time involved in the conveyance between two spots is normally relatively short time, e.g. several minutes. Since it takes more than one hour for the spontaneous oxide film to be formed on the surface of the semiconductor wafer, the formation of the spontaneous oxide film can be ignored during the conveyance so that the conveyance between the manufacturing spots has been made in the atmosphere.

It is a matter of course that the formation of the spontaneous oxide film can be ignored when the conveying system employing the unmanned carriage is normally operated. However, when the unmanned carriage does not operate as scheduled due to accidents such as a breakdown of a destination semiconductor manufacturing apparatus to which the unmanned carriage reaches, a breakdown of the conveying system, a stoppage of appliance and apparatus because of the power failure and an obstruction in the conveying route, the semiconductor wafer is left alone on the conveying carriage for a long time, which caused such a problem that the formation of the spontaneous oxide film grows rapidly during the period.

It is a first object of the present invention to provide an unmanned conveying device capable of restraining the spontaneous oxide film from growing in case that the conveyance is obliged to be interrupted for a long time due to its own cause or the cause of the destination spot, etc.

It is a second object of the present invention to provide an unmanned conveying device for a clean room with high safety, which is capable of restraining the spontaneous oxide film from growing without making the carriage largescale or heavyweight by obtaining inert gas from an inert gas reserving source which is installed on the ground.

BRIEF DESCRIPTION OF THE DRAWINGS

FIG. 5 (A) is a front view showing a movable coupler unit according to the first example of the second embodiment of the present invention;

DESCRIPTION OF THE PREFERRED EMBODIMENT

Figure 1:
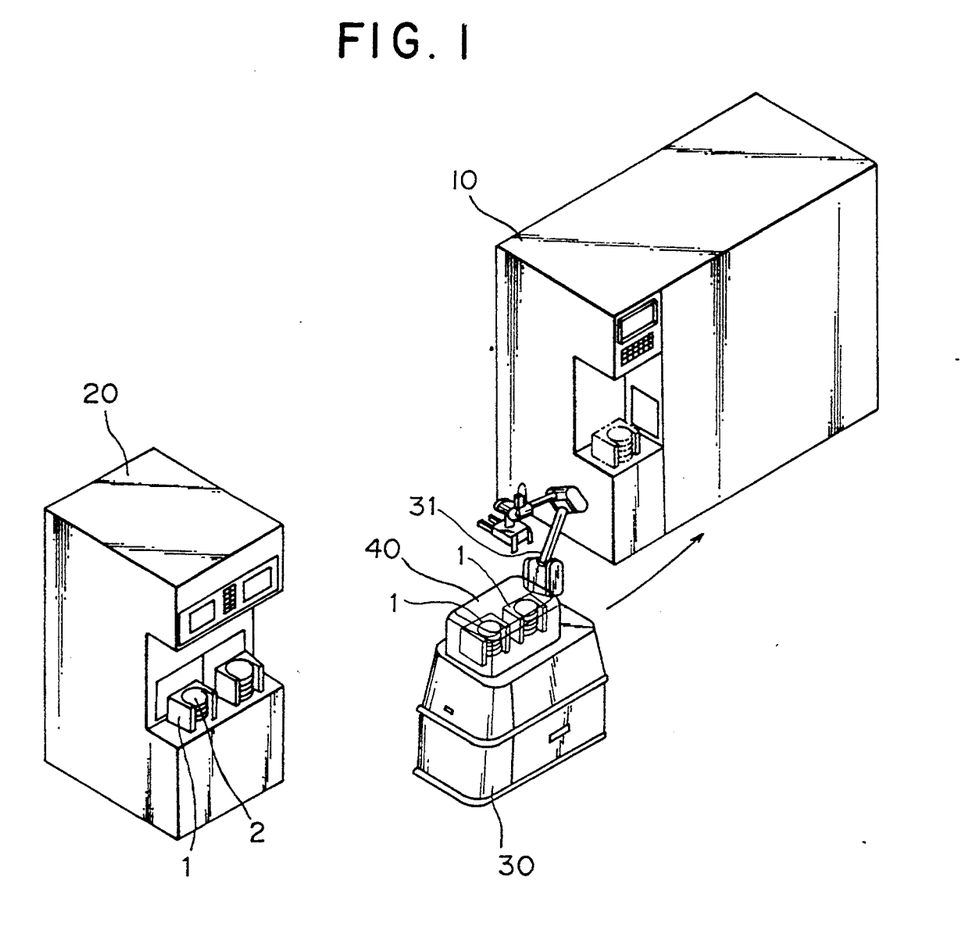
FIG. 1 is a view showing the state where an unmanned conveying device is used according to a first embodiment of the present invention.
Figure 2:
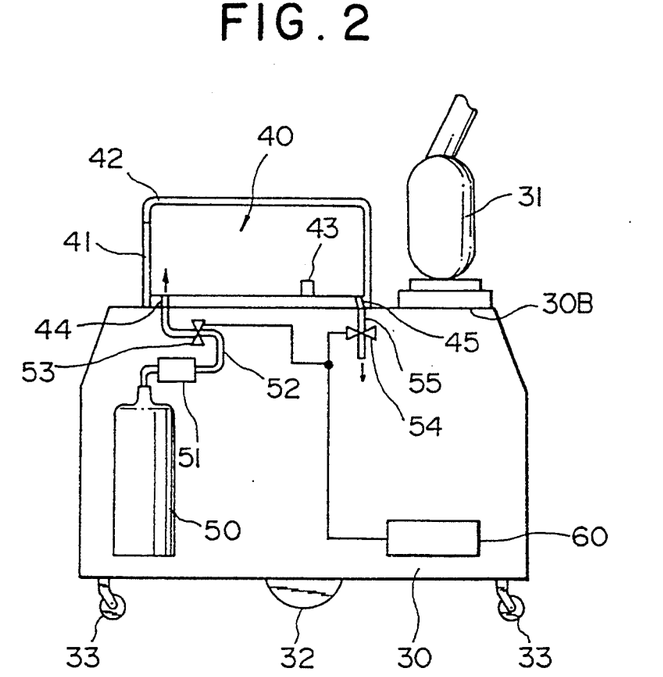
FIG. 2 is a view showing a concrete structure of an unmanned carriage according to a first example of the first embodiment of the present invention.
Figure 3:
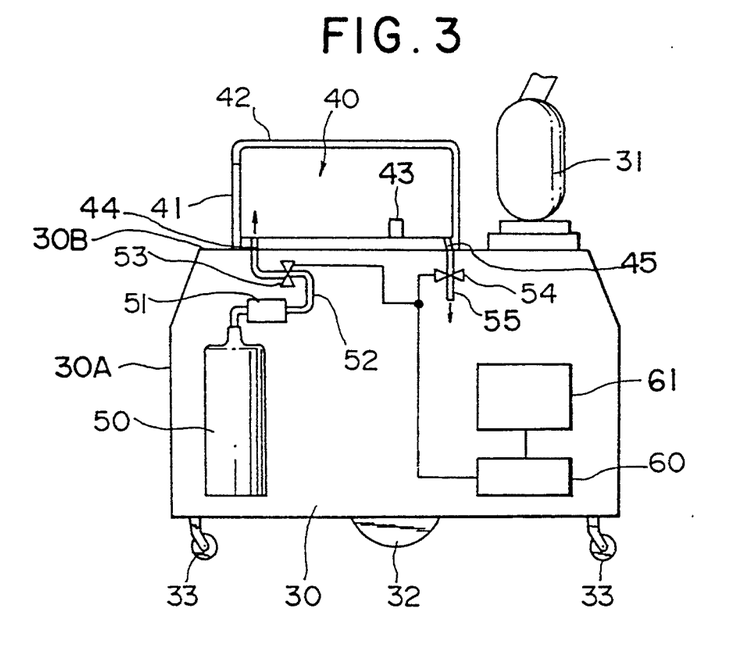
FIG. 3 is a view showing a concrete structure of the unmanned carriage according to a second example of the first embodiment of the present invention.

First Embodiment (FIGS. 1 to 3)

FIRST EXAMPLE (FIGS. 1 and 2)

An unmanned conveying device according to a first example of a first embodiment will be described with reference to FIGS. 1 and 2.

In FIG. 1, semiconductor manufacturing apparatus 10 and 20 are disposed in a given interval in a clean room. The semiconductor manufacturing apparatus have respectively wafer cassettes 1 respectively accommodating semiconductor wafers 2 therein. An unmanned carriage 30 has a loading robot 31 at one side thereof on a ceiling 30B of a carriage frame 30A and a conveying box 40 at the other side on the ceiling 30B which is fixed thereto. The unmanned carriage 30 also has a driving wheel 32 and casters 33. The conveying box 40 has a cover 42 which is attached to a box body 41 by hinges, not shown, and a sensor inside thereof, which serves to detect the presence of the wafer cassette 1. The cover 42 is opened or closed by a closing mechanism, not shown, e.g. a motor-driven cylinder. The conveying box 40 has a gas introduction port 44 and an exhaust port 45 at the bottom wall thereof.

The carriage frame 30A of the unmanned carriage 30 has inside thereof an inert gas cylinder 50 (a nitrogen gas cylinder in this case). A port of the nitrogen gas cylinder 50 and the gas introduction port 44 of the conveying box 40 are connected by a gas supply pipe 52 having a pressure reduction valve 51 and a supply valve 53 thereon. An exhaust pipe 55 extends from the exhaust port 45 of the conveying box 40 to the inside of the carriage frame 30A penetrating the ceiling 30B. A controller 60 receives a detecting signal issued by a detector, etc., described later, and also receives a predetermined timing signal from and sends the predetermined timing signal to a main control apparatus, not shown, for controlling the unmanned carriage 30 and the loading robot 31, for thereby issuing loading and closing signals to the gas supply valve 53 and the exhaust valve 54 and also issuing a signal for opening and closing the cover 42 of the conveying box 40.

An operation of the unmanned conveying device will be described hereinafter.

Suppose that the wafer cassette 1 on the semiconductor manufacturing apparatus 20 is conveyed to the semiconductor manufacturing apparatus 10. When the unmanned carriage 30 stops at a given position in front of the semiconductor manufacturing apparatus 20 or reaches a position short of the given position, the following procedures are taken.

(1) The motor-driven cylinder in the conveying box 40 is synchronized with the timing signal supplied from the main control apparatus to the controller 60 so that it elongates its rod to thereby open the cover 42. When the cover 42 is opened to a given position, a cover opening detecting sensor (hereinafter referred to as a cover opening detecting limit switch), not shown, operates. When the unmanned carriage 30 stops at the given position in front of the semiconductor manufacturing apparatus, the arm and the wrist portion of the loading robot 31 starts the loading operation in accordance with a given program provided that the cover opening detecting limit switch generated the detecting signal.

(2) When the wafer cassette 1 is transferred from the semiconductor manufacturing apparatus 20 to the conveying box 40 by the loading operation of the loading robot 31 and housed in the conveying box 40, the sensor 43 outputs the signal whereby the motor-driven cylinder on the conveying box 40 contracts its rod to thereby close the cover 42. When the cover 42 is closed, a cover closing detecting sensor (hereinafter referred to as a cover closing detecting limit switch), not shown, operates.

(3) When the cover 42 is closed completely, that is, when the cover closing detecting limit switch supplies a signal, a timer, not shown, in the controller 60 starts counting of the time so that the exhaust valve 54 is opened and the gas supply valve 53 is successively opened whereby the nitrogen gas is jetted from the nitrogen gas cylinder 50 toward the conveying box 40. The air in the conveying box 40 is pressed out by the nitrogen gas and discharged inside the carriage frame 30A through the exhaust port 45, so that the inside of the conveying box 40 is replaced by the nitrogen gas. Time $T_k$ involved in replacing the air by the nitrogen gas is set by the timer. When the timer counts the time $T_k$, the exhaust valve 54 is closed and the gas valve 53 is successively closed.

(4) When the exhaust valve 54 and the gas supply valve 53 are closed, the unmanned carriage 30 executes a travelling program for travelling toward the semiconductor manufacturing apparatus 10 and starts to travel toward the semiconductor manufacturing apparatus 10.

(5) When the unmanned carriage 30 stops at the given position in front of the semiconductor manufacturing apparatus 10 or reaches the position short of the given position, the motor-driven cylinder in the conveying box is synchronized with the timing signal which is supplied from the main control apparatus to the controller 60 so that it elongates its rod to thereby open the cover 42. When the unmanned carriage 30 stops at the given position in front of the semiconductor manufacturing apparatus 10, the arm and the wrist portion of the loading robot 31 starts the loading operation in accordance with the given program so that the wafer cassette 1 on the conveying box 40 is loaded onto the semiconductor manufacturing apparatus 10.

According to the first embodiment, inasmuch as the unmanned carriage 30 is conveyed from the given position to another given position while the wafer cassette 1 accommodating the semiconductor wafer 2 therein is housed in the conveying box 40 and the inside of the conveying box 40 is in the atmosphere of the nitrogen gas as the inert gas, it is possible to restrain the spontaneous oxide film from growing on the surface of the semiconductor wafer 2 even in the case that the unmanned carriage 30 is obliged to stop for a long time due to some cause (the time sufficient for the spontaneous oxide film to grow) on the way of conveyance to the destination spot.

SECOND EXAMPLE (FIG. 3)

An unmanned conveying device according to a second example will be described with reference to FIG. 3.

An arrangement of the unmanned conveying device of the second example is the same as that of the first example except a clock circuit 61. That is, the clock circuit 61 of the second example counts a time T which is compared with a set time $T_O$ in the controller 60. If the counted time T is greater than the set time $T_O$, the controller 60 issues an opening signal to the gas supply valve 63 and the exhaust valve 64. The set time $T_O$ is determined to be the safe time during which the spontaneous oxide film does not grow, e.g. within ten minutes.

An operation of the unmanned conveying device according to the second example will be described hereinafter.

Suppose that the wafer cassette 1 on the semiconductor manufacturing apparatus 20 is conveyed to the semiconductor manufacturing apparatus 10.

When the unmanned conveying carriage 30 stops at a given position or reaches the position short of the given position, (1) the motor-driven cylinder in the conveying box 40 is synchronized with the timing signal supplied from the main controller apparatus to the controller 60 so that it elongates its rod to open the cover 42. When the cover 42 is opened to a given position, the cover opening detecting limit switch operates. When the unmanned carriage 30 stops at the given position in front of the semiconductor manufacturing apparatus 20, the arm and the wrist portion of the loading robot 31 starts the loading operation in accordance with the given program provided that the cover opening detecting limit switch generated the detecting signal.

(2) When the wafer cassette 1 is transferred from the semiconductor manufacturing apparatus 20 to the conveying box 40 by the loading operation of the loading robot 31 and housed in the conveying box 40, the sensor 43 outputs the signal and the time circuit 61 starts to count the time. The motor-driven cylinder in the conveying box 40 contracts its rod to thereby close the cover 42. When the cover 42 is closed, the cover closing detecting limit switch operates.

(3) When the cover 42 is closed completely, the unmanned carriage 30 executes the travelling program and starts to travel toward the semiconductor manufacturing apparatus 10.

(4) When the unmanned carriage 30 stops at the given position in front of the semiconductor manufacturing apparatus 10 or reaches the position short of the given position, the motor-driven cylinder in the conveying box is synchronized with the timing signal which is supplied from the main control apparatus to the controller 60 so that it elongates its rod to thereby open the cover 42. When the unmanned carriage 30 stops at the given position in front of the semiconductor manufacturing apparatus 10, the arm and the wrist portion of the loading robot 31 starts the loading operation in accordance with the given program so that the wafer cassette 1 on the conveying box 40 is loaded onto the semiconductor manufacturing apparatus 10.

(5) When the unmanned carriage 30 is obliged to stop for a long time due to some cause on the way of conveyance to the destination spot and the set time $T_O$ lapses during the stoppage thereof, the controller 60 issues a valve opening instruction signal to the gas supply valve 53 and the exhaust valve 54 and the timer starts to count the time. As a result, both the gas supply valve 53 and the exhaust valve 54 are opened whereby the nitrogen gas is jetted from the nitrogen gas cylinder 50 into the conveying box 40. The air in the conveying box 40 is pressed out by the nitrogen gas and discharged into the carriage frame 30A through the exhaust port 45 whereby the air in the conveying box 40 is replaced by the nitrogen gas. When the timer counted the time $T_k$, the exhaust valve 54 is closed and the gas valve 53 is successively closed.

The semiconductor wafer 2 is conveyed from the semiconductor manufacturing apparatus 20 to the semiconductor manufacturing apparatus 10 while the conveying box 40 is in the atmosphere during the set time or the safe time $T_O$ when the spontaneous oxide film does not grow and the air in the conveying box 40 is replaced by the nitrogen gas when the safe time $T_o$ lapses so that the following advantage can be obtained compared with the unmanned conveying device of the first example.

Since there is no likelihood of sharp growth of the spontaneous oxide film in case that the interval between the semiconductor manufacturing apparatus 10 and 20 is short and the time involved in the conveyance of the wafer cassette by the unmanned carriage 30 is short, e.g. several minutes, in case of the unmanned conveying device of the first example the nitrogen gas is wasted, the nitrogen gas is discharged into the atmosphere every time each conveying step is completed, and content of oxygen is liable to lower in the narrow clean room. On the other hand, in case the unmanned conveying device according to the second example, it is possible to prevent the nitrogen from being wasted and the content of oxygen in the clean room is not liable to lower since the air in the conveying box is replaced by the nitrogen gas only when the normal travel of the unmanned carriage 30 is hindered and nitrogen gas is kept inside the conveying box until the impeded conveying step is over.

According to the second example, the gas supply valve 53 and the exhaust valve 54 are closed after the air in the conveying box is replaced by the nitrogen gas and the supply of the nitrogen gas to the conveying box 40 is stopped. The gas supply valve 53 may serve not only as the closing valve but also as a solenoid control valve capable of controlling the opening of the valve so as to omit the exhaust valve 54 whereby the small amount of nitrogen gas is kept being supplied to the conveying box 40 while the valve is throttled after the air in the conveying box 40 is replaced by the nitrogen gas to thereby form a nitrogen gas flow which extends from the gas introduction port 44 to the exhaust port 54 of the conveying box 40.

According to the second example, although the nitrogen gas is supplied from one gas supply valve 53, an auxiliary valve (solenoid valve) for the small amount of flow of the gas may be provided in addition to the gas supply valve 53 wherein the gas valve 53 is closed after the completion of the replacement of the gas and the small amount of gas is supplied from the auxiliary valve.

According to the first example, the unmanned carriage 30 starts to travel after the completion of the replacement of the gas in the conveying box 40 but the air may be replaced by the nitrogen gas while the unmanned carriage 30 travels.

Although the air in the conveying box 40 is pressed out and replaced by the nitrogen gas according to the second example, the air in the conveying box may be sucked by a vacuum pump and thereafter the nitrogen gas is supplied into the conveying box 40. Although the time for supplying the nitrogen gas is prescribed by the timer, not shown, in the controller 60, a meter for measuring the content of oxygen or nitrogen in the conveying box 40 may be provided to close the gas supply valve 53 and the exhaust valve 54 at a proper time.

The conveying box 40 may have a structure in which a part of the ceiling 30B of the carriage frame 30A forms a bottom of the conveying box 40 and the conveying box covers the bottom.

Although the conveying box 40 is fixed to the carriage frame 30A, it may not be fixed to the carriage frame 30A but may be transferred to or received from the semiconductor manufacturing apparatus 10 and 20. In the second example, the semiconductor wafer is transferred to or received from the semiconductor manufacturing apparatus 10 and 20 on the ground by the loading robot 31 mounted on the unmanned carriage 30, it can be transferred to or received from the semiconductor manufacturing apparatus 10 and 20 by the loading robot mounted on these semiconductor manufacturing apparatus 10 and 20.

With the arrangement of the unmanned conveying device according to the first embodiment, that is, the semiconductor wafer is housed in the conveying box which is connected to the inert gas cylinder by way of the valve and the atmosphere in the box is replaced by the nitrogen gas, so that the spontaneous oxide film is prevented from growing on the semiconductor wafer during the conveyance of the semiconductor wafer, and it is possible to improve the manufacturing yield of the semiconductor device and to be employed effectively in manufacturing lines of the semiconductors of high integration.

Since the inert gas reserving source which is largescale and heavyweight such as the nitrogen gas cylinder is mounted on the unmanned carriage 30, the unmanned carriage 30 becomes largescale and heavyweight and the frequency of charging of the battery mounted on the unmanned carriage is increased.

The inert gas reserving source should be replaced by a new one when the gas reserved in the gas reserving source is consumed, which requires manpower and the unmanned carriage 30 or the unmanned conveying device system should be stopped as a whole and the automatic mode is called off during the replacement of the inert gas reserving source.

Since the inert gas is contained in a high pressure container, it is dangerous to mount the inert gas reserving source on the unmanned carriage 30 if the worst should happen such as the reckless traveling of the unmanned carriage 30. In view of these problems, the inventor of the present application develops the unmanned conveying device for the clean room capable of obtaining the inert gas from the inert gas reserving source disposed on the ground. The unmanned conveying device of this type will be described hereinafter with reference to the second embodiment.

Second Embodiment (FIGS. 4 to 13)

FIRST EXAMPLE (FIGS. 4 to 9)

An unmanned conveying device according to a first example of a second embodiment will be described with reference to FIGS. 4 to 9.

Figure 4:
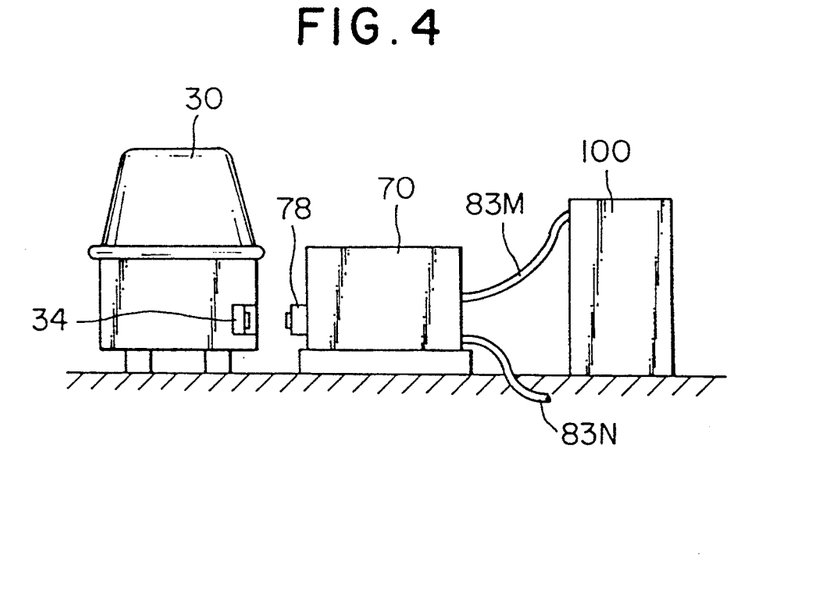
FIG. 4 is a view showing a concrete structure of an unmanned carriage according to a first example of a second embodiment of the present invention.
Figure 5A:
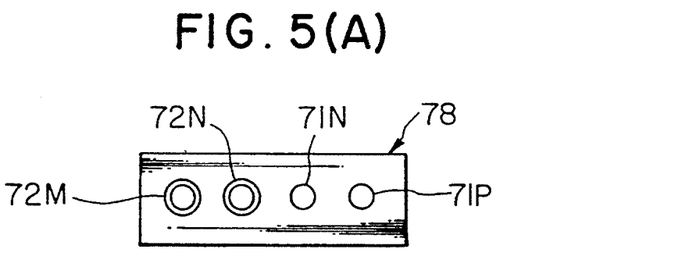

In FIG. 4, denoted at 70 is a coupler device 70 on the ground which is disposed on a work station provided with the semiconductor manufacturing apparatus 20 in FIG. 1 and includes movable connecters 71P and 71N through which signals are sent and received (hereinafter referred to as movable connectors 71P and 71N), an air supply coupling 72M and an exhaust coupling 72N as illustrated in FIG. 5A. Denoted at 100 is an inert gas reservoir. 34 is a coupler unit on the unmanned carriage 30.

Figure 6:
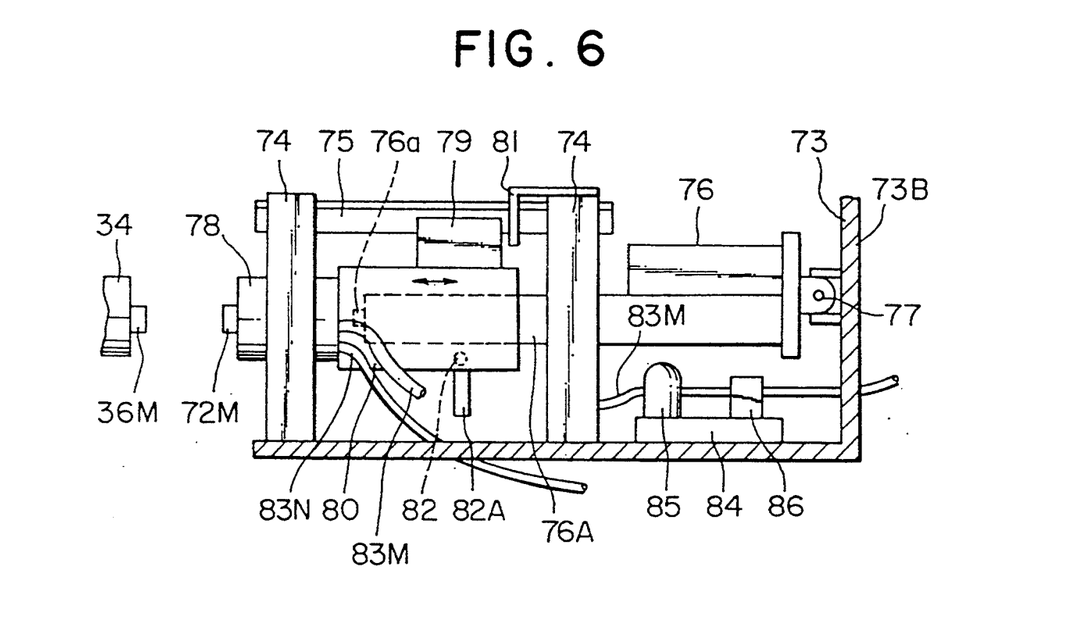
FIG. 6 is a front view showing an arrangement of a coupler device which is installed on the ground according to the first example of the second embodiment of the present invention.

FIG. 6 shows an example of the coupler device 70 on the ground. The coupler device 70 comprises a frame 73, gate-shaped supporting frames 74 and 74, a linear guide rail 75 supported by the supporting frames 74 and 74 and a motor-driven linear actuator 76 which is supported by a rear wall 73B of the frame 73 by way of a pin 77. The coupler device 70 further comprises a coupler unit 78 which has a front end surface from which the movable connecters 71P and 71N, the air supply coupling 72M and the exhaust coupling 72N protrude. The coupler unit 78 is fixed to the front end surface of a block 80 which is hung and supported by a retaining member 79 engaged with the linear guide rail 75. The block 80 is connected to an telescopic rod 76a of a motor-driven cylinder 76 which passes inside thereof. The coupler device 70 still further comprises a mechanical stopper 81 relative to the linear guide rail 75, an electric stopper 82 having a detecting dog 82A fixed to the block 80, an air supply pipe 83M, an exhaust pipe 83N in which the air supply pipe 83M is connected to the air supply coupling 72M at one end thereof and connected to the inert gas reservoir 100 at the other end thereof by way of a closing valve 85, a pressure reduction valve 86 and a pipe 87 respectively disposed on a fixing table 84. The exhaust pipe 83N is connected to the exhaust coupling 72N at one end thereof and to an exhaust facility, not shown, at the other end thereof.

Figure 5B:
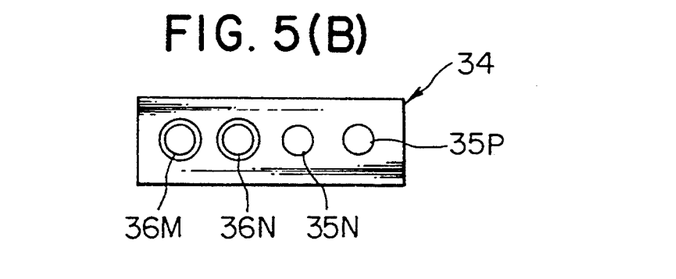
FIG. 5(B) is a front view showing a fixed coupler unit according to the first example of the second embodiment of the present invention.
Figure 7:
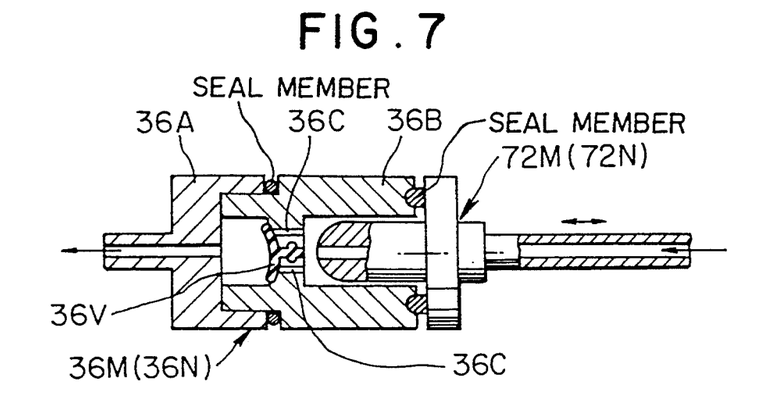
FIG. 7 is a view showing an arrangement of an air supply coupling and an exhaust coupling of the fixed coupler unit according to the first example of the second embodiment of the present invention.
Figure 8:
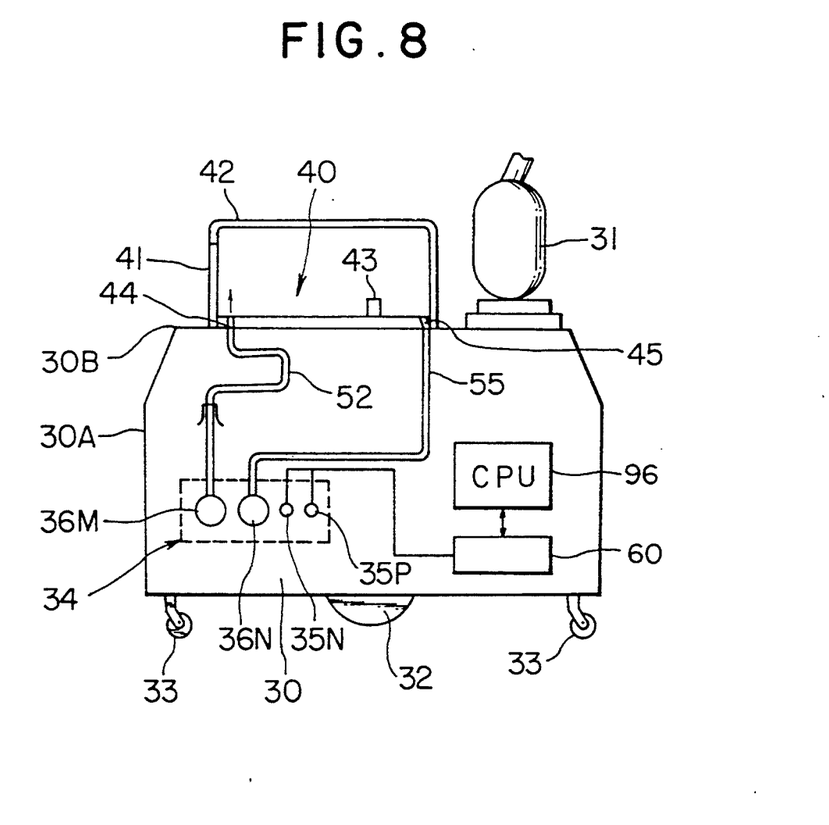
FIG. 8 is an internal arrangement of the unmanned carriage according to the first example of the second embodiment of the present invention.
Figure 9:
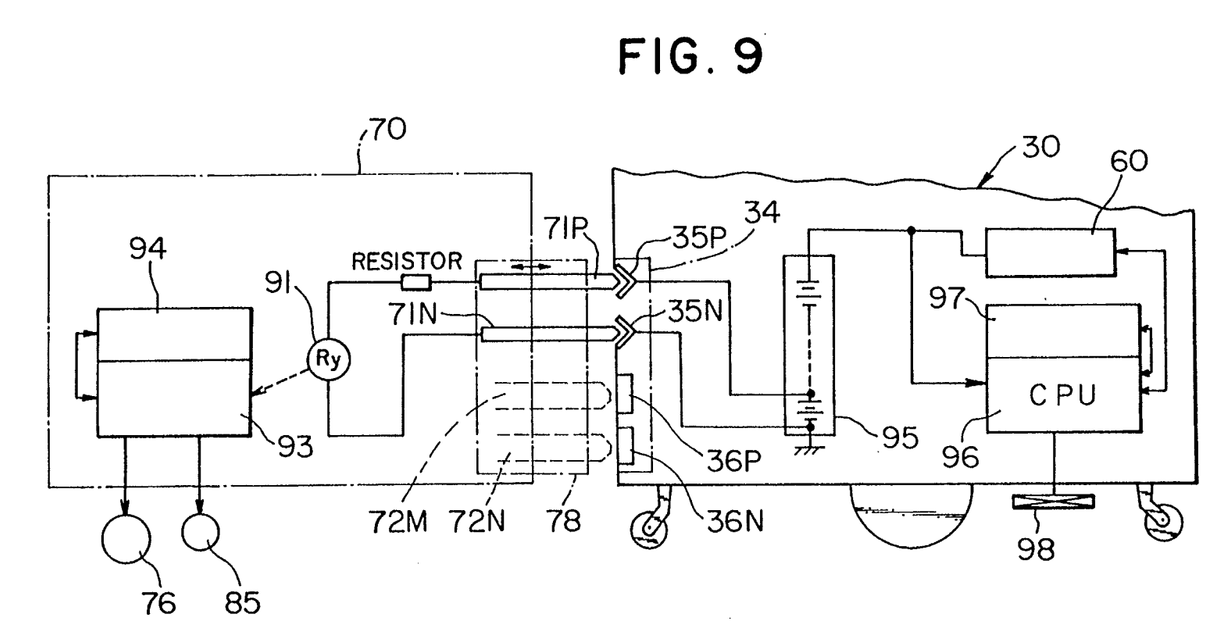
FIG. 9 is a gas passage connection control circuit in the arrangement according to the first example of the second embodiment of the present invention.

The coupler unit 34 of the unmanned carriage 30 comprises, as illustrated in FIG. 5 (B), the movable connectors 71P and 71N, fixed connectors 35P and 35N through which signals are sent and received (hereinafter referred to as fixed connectors 35P and 35N) and which are respectively capable of connecting automatically to the movable connectors 71P and 71N, the air supply coupling 72M, the exhaust coupling 72N, the air supply coupling 36M and the exhaust coupling 36N which are respectively connecting automatically to the air supply coupling 72M and the exhaust coupling 72N. As illustrated in FIG. 6, the air supply coupling 36M communicates with the gas introduction port 44 in the conveying box 40 through the gas supply passage 52 while the exhaust coupling 36N communicate with the exhaust port 45 of the conveying box 40 through the exhaust pipe 55. The air supply coupling 36M and the exhaust coupling 36N comprises, as illustrated in FIG. 7, one directional coupling provided with a check valve 36V. In FIG. 7, denoted at 36A and 36B are coupling bodies and 36C is a valve hole. The movable connectors 71P and 71N, the fixed connectors 35P and 35N are respectively elements for constituting a gas passage connection control circuit as illustrated in FIG. 9 in which a relay 91 serving as a gas passage connection detector is interposed between the movable connectors 71P and 71N while a battery 95, which is mounted on the unmanned carriage 30, is interposed between the fixed connectors 35P and 35N to thereby apply a part of the voltage to both the fixed connectors 35P and 35N. A controller 93 for controlling the coupler device 70 on the ground is provided with a radio communication unit 94 and controls the motor-driven linear actuator 76 and the closing valve 85. A CPU 96 is a main control apparatus of the unmanned carriage 30 and has a radio communication unit 97. A position detector 98 is disposed under the floor of the unmanned carriage 30.

The unmanned conveying device according to the first example of the second embodiment will be described hereinafter.

Suppose that the wafer cassette 1 on the semiconductor manufacturing apparatus 20 is conveyed to the semiconductor manufacturing apparatus 10.

(1) When the unmanned carriage 30 travels to the portion adjacent to the work station on which the semiconductor manufacturing apparatus 20 is installed, the motor-driven cylinder, not shown, on the conveying box 40 is synchronized with the timing signal which is supplied from the CPU 96 to the controller 60 and elongates its rod to thereby open the cover 42. When the cover 42 is opened at the given position, the cover opening detecting limit switch operates.

(2) When the unmanned carriage 30 reaches in front of the semiconductor manufacturing apparatus 20 and the CPU 96 verifies the correct stoppage of the unmanned carriage 30 in front of the semiconductor manufacturing apparatus 10 based on the output from the position detector upon detection of the ground mark informing the regular stop position, the arm and the wrist portion of the loading robot 31 starts the loading operation in accordance with the given program on the condition that the cover opening detecting limit switch generated the detecting signal.

(3) Whereupon, the CPU 96 issues a gas passage connection instruction to the controller 93 of the coupler device 70 on the ground by the radio communication (optical communication in this case) upon verification of the correct stoppage of the unmanned carriage 30 at the given position. Upon reception of the gas passage connection instruction, the motor-driven linear actuator 76 of the coupler device 70 on the ground operates to thereby elongate the telescopic rod 76a so that the movable coupler unit 78 moves horizontally at a given interval toward the fixed coupler unit 34 of the unmanned carriage 30 whereby the movable connectors 71P and 72N are brought into contact with the fixed connectors 35P and 35N with a given pressure while the air supply coupling 72M and the exhaust coupling 72N of the movable coupler unit 78 are respectively connected to the air supply coupling 36M and the exhaust coupling 36N of the fix coupler unit 34. When the fixed connectors 71P and 71N are respectively brought into contact with the fixed connectors 35P and 35N with the given pressure, the coil of the relay 91 is biased and the relay contact is closed.

(4) When the wafer cassette 1 is transferred from the semiconductor manufacturing apparatus 20 and housed in the conveying box 40 by the loading operation of the loading robot 31, the sensor 43 issues a signal so that the motor-driven cylinder on the conveying box 40 starts to contract its rod to thereby close the cover 42. When the cover 42 is closed, the cover closing detecting limit switch operates.

(5) When the cover 42 is closed completely, that is, when the cover closing detecting limit switch issues a signal, the controller 60 issues a gas supply start instruction (valve opening instruction) to the CPU 96 and the timer in the controller 60 starts to count the time. The CPU 96 converts the gas supply start instruction into the radio signal and transmits the thus converted radio signal to the controller 90 of the coupler device 70 on the ground.

(6) When the controller 90 receives the radio signal, it issues the valve opening instruction to the closing valve 85 provided that the relay contact is closed. When the valve opening instruction is issued, the closing valve 85 is opened so that the nitrogen gas flows from the nitrogen gas cylinder 100 through the air discharge pipe 83M, air discharge couplings 72M and 36M, the gas supply passage 52 and the gas introduction port 44 and is jetted into the conveying box 40. The air in the conveying box 40 is pressed out by the nitrogen gas and discharged from the exhaust port 45 to the exhaust pipe 55 whereby the air in the conveying box 40 is replaced by the nitrogen gas. The thus discharged air is exhausted to the exhaust facility through the exhaust couplings 36N and 72N and the exhaust pipe 83N.

The time $T_k$ involved in the replacement of the air by the nitrogen gas is determined by the timer. When the $T_k$ is counted by the timer, the controller 60 issues a gas stop instruction (valve closing instruction) to the CPU 96. The CPU 96 converts the gas stop instruction into a radio signal and transmits the thus converted radio signal to the controller 93 of the coupler device 70 on the ground.

(7) When the controller 93 receives the radio signal, it gives the valve closing instruction to the closing valve 85 to thereby reciprocate the motor-driven linear actuator 76, whereby the closing valve 85 is closed and the telescopic rod 76a is contracted and thereafter the movable coupler unit 78 retracts from the fixed coupler unit 34 of the unmanned carriage 30 and the movable connectors 71P and 71N are respectively moved away from the fixed connectors 35P and 35N. At the same time, the air supply coupling 72M and the exhaust coupling 72N of the movable coupler unit 78 are respectively disconnected from the air supply coupling 36M and the exhaust coupling 36N of the fixed coupler unit 34.

(8) The controller 93 converts the a contact output OFF of the relay 90 into the radio signal which is transmitted to the CPU 96. The CPU 96, upon reception of this signal, permits the unmanned carriage 30 to start execution of the program for travelling toward the semiconductor manufacturing apparatus 10 whereby the unmanned carriage 30 starts to travel toward the semiconductor manufacturing apparatus 10.

When the air supply coupling 36M and the exhaust coupling 36N are disconnected from the air supply coupling 72M and the exhaust coupling 72N, the nitrogen gas in the conveying box 40 is prevented from flowing outside the conveying box 40 and is remained in the conveying box 40 during the travelling of the unmanned carriage 30 toward the semiconductor manufacturing apparatus 10 due to the operation of the check valve 36V of the air supply coupling 36M and the exhaust coupling 36N.

(9) When the unmanned carriage stops at the given position in front of the semiconductor manufacturing apparatus 10, or reaches the position short of the given position, the motor-driven cylinder on the conveying box 40 is synchronized with the timing signal which is supplied from the CPU 96 to the controller 60 and elongates its rod to thereby open the cover 42. When the unmanned carriage 30 stops at the given position in front of the semiconductor manufacturing apparatus 10, the arm and the wrist portion of the loading robot 31 starts the loading operation in accordance with the given program, whereby the wafer cassette 1 in the conveying box 40 is loaded on the semiconductor manufacturing apparatus 10.

According to the first example of the second embodiment, since the unmanned carriage 30 travels from one given position to another given position while the wafer cassette 1 accommodating therein the semiconductor wafers 2 is housed in the conveying box 40 and the conveying box 40 is in the atmosphere of the nitrogen gas as the inert gas, it is possible to restrain the spontaneous oxide film from growing on the surface of the semiconductor wafer 2 even in the case that the unmanned carriage 30 is obliged to stop for a long time due to some cause (the time sufficient for the spontaneous oxide film to grow) on the way of the conveyance to another given position.

Furthermore, according to the first example of the second embodiment, since the inert gas reservoir 100 is installed at the work station which is located at the starting point of the travelling route in which the the air in the conveying box 40 is necessitated to be replaced by the inert gas, and the inert gas is supplied from the inert gas reservoir 100 to the conveying box 40 so that it is not necessary to load the inert gas reserving source on or unload the inert gas reserving source from the carriage body for the replacement thereof and the time and labor involved in the replacement thereof is omitted. It is a matter of course that the carriage body is not rendered to be largescale or heavyweight since the inert gas reserving source is not mounted on the unmanned carriage 30.

In case that the unmanned carriage 30 is of an automatic charging type wherein the battery 95 of the unmanned carriage 30 is automatically charged at the charging station having the inert gas reservoir 100, the coupler unit provided with the charging connector can be utilized which is convenient and of low cost.

Figure 10:
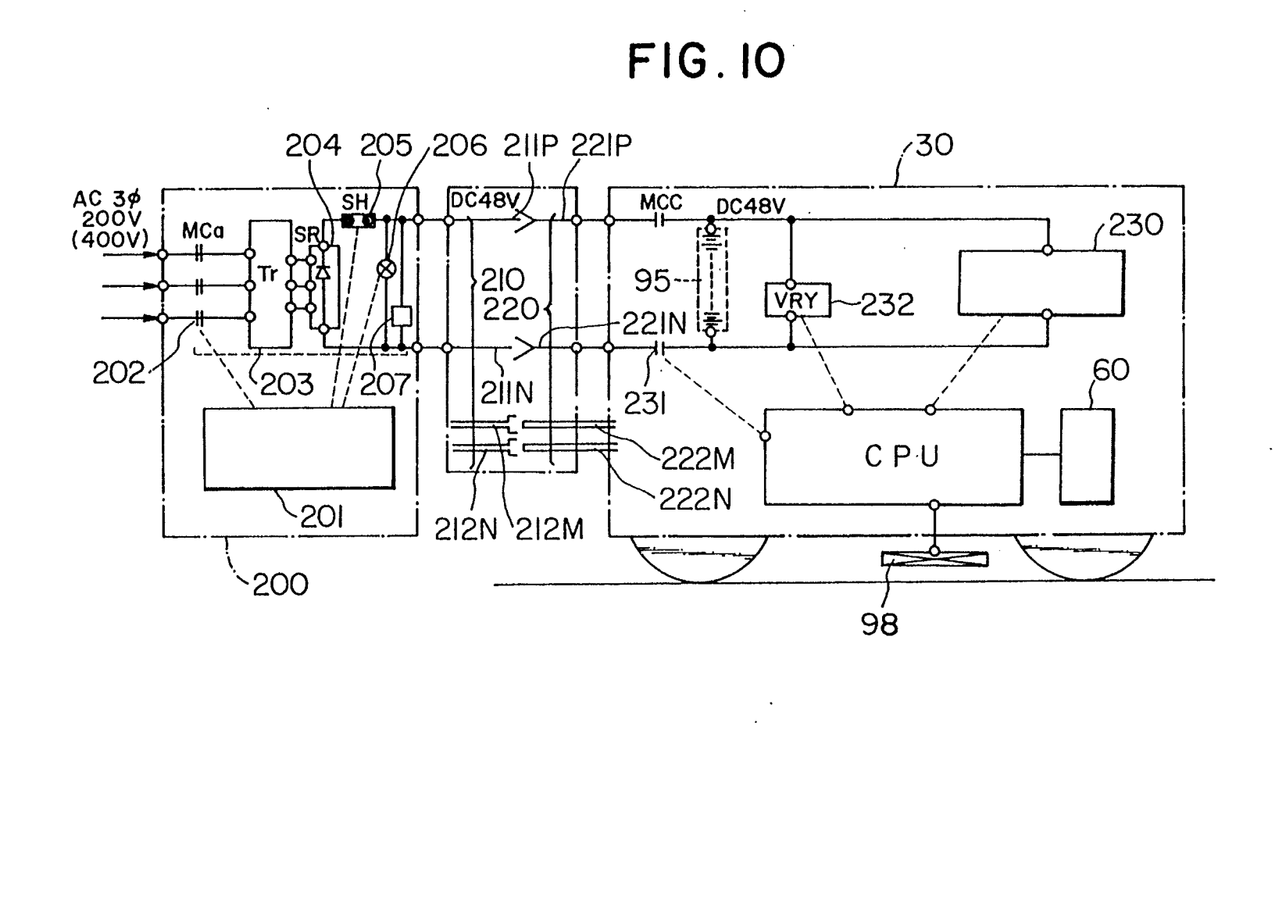
FIG. 10 is a circuit diagram of an arrangement according to a second example of the second embodiment of the present invention.

SECOND EXAMPLE (FIG. 10)

An unmanned conveying device according to a second example of the second embodiment, i.e., one example for commonly using the charging coupler unit will be described with reference to FIG. 10. In FIG. 10, denoted at 200 is a charger which comprises a control circuit 201 for controlling the charger 200, a contactor MCa, a transformer 203, a rectifier 204, a shunt resistor 205, a relay 206 serving in the same way as the relay 91 in FIG. 9 and a resistor 207. A coupler unit 210 of a coupler device on the ground includes charging connectors 211P and 211N, an air supply coupling 212M and an exhaust coupling 212N. A coupler unit 220 on the unmanned carriage 30 includes charging connectors 221P and 221N, an air supply coupling 222M and an exhaust coupling 222N. Denoted at 230 is a travelling controller, 231 is a contactor MCC and 232 is a discharge detector.

According to the second example of the second embodiment, the charging connectors 221P and 221N and the charging connectors 211P and 211N respectively serve both as the fixed connectors 35P and 35N and the movable connectors 71P and 71N. The gas passage connection detection is made by utilizing a contact output of the relay 206 wherein the closing valve 85 is closed by the contact output.

Figure 11A:
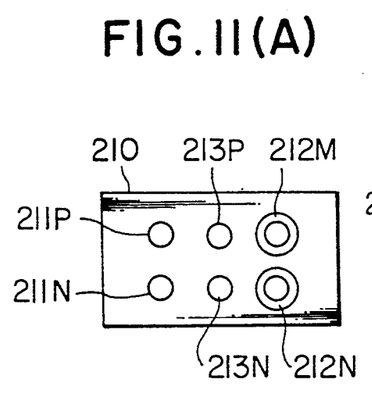
FIGS. 11(A) and 11(B) are views similar to FIGS. 5(A) and 5(B), but showing coupler units according to a third example of the second embodiment of the present invention.
Figure 11B:
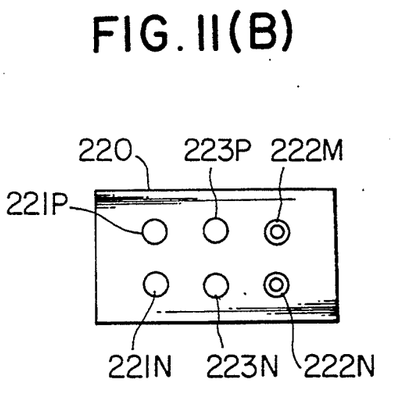
Figure 12A:
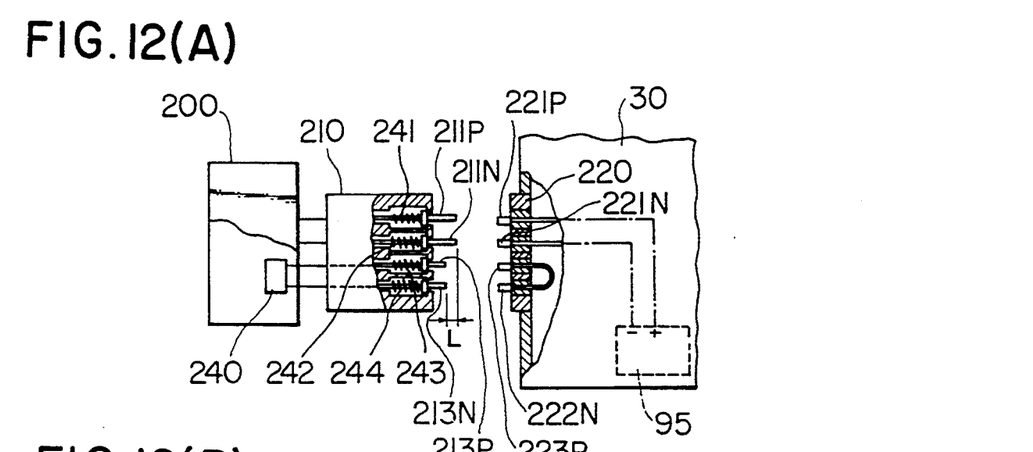
FIGS. 12(A), 12(B) and 12(C) are fragmentary side views showing respective operational positions of a coupling verification means according to the third example of the second embodiment of the present invention.
Figure 12B:
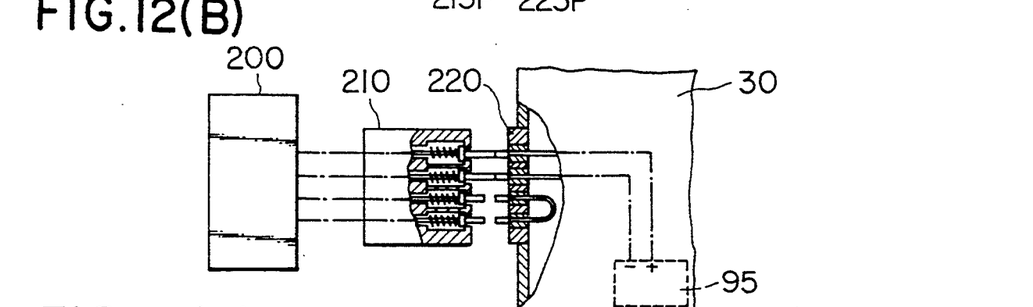
Figure 12C:
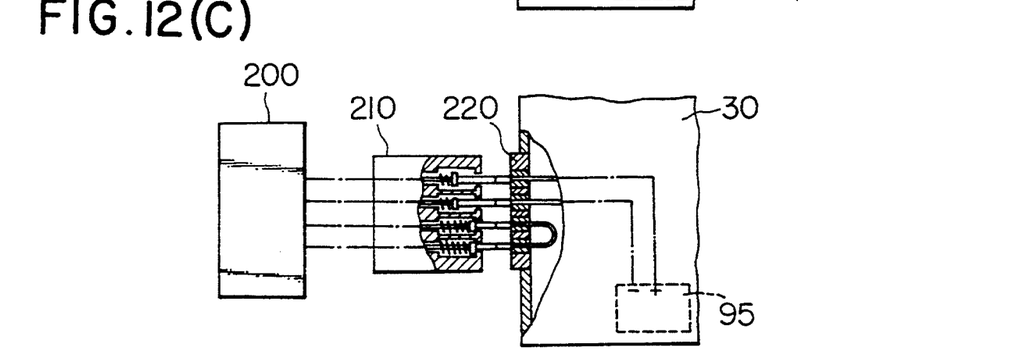

THIRD EXAMPLE (FIGS. 11 and 12)

An unmanned conveying device according to the third example of the second embodiment will be described with reference to FIGS. 11 and 12.

If a connector coupling verification means does not employ the relay 206 as illustrated in FIG. 10 but employs auxiliary terminals 213P and 213N provided in the coupler unit 210, auxiliary terminals 223P and 223N provided in the coupler unit 220 and a coupling verification circuit 240, the closing valve 85 is opened by the output of the coupling verification circuit 240. In FIG. 12, denoted at 241 to 244 are coil springs.

The auxiliary terminals 213P and 213N protruding from the coupler unit 210 have lengths which are shorter than those of the charging connectors 211P and 211N by the length of L. When the coupler unit 210 moves further rightward in FIGS. 12 (A), (B) and (C) for the interval L (refer to FIG. 12 (C)) after the charging connectors 211P and 211N are brought into contact with the charging connectors 221P and 221N (refer to FIG. 12(B)), the contact pressure between the charging connectors 211P and 211N and the charging connectors 221P and 221N are set to be given pressures. When the auxiliary terminals 213P and 213N respectively electrically contact the auxiliary terminals 223P and 223N, the coupling verification circuit 240 permits the charger 200 to start charging.

Figure 13:
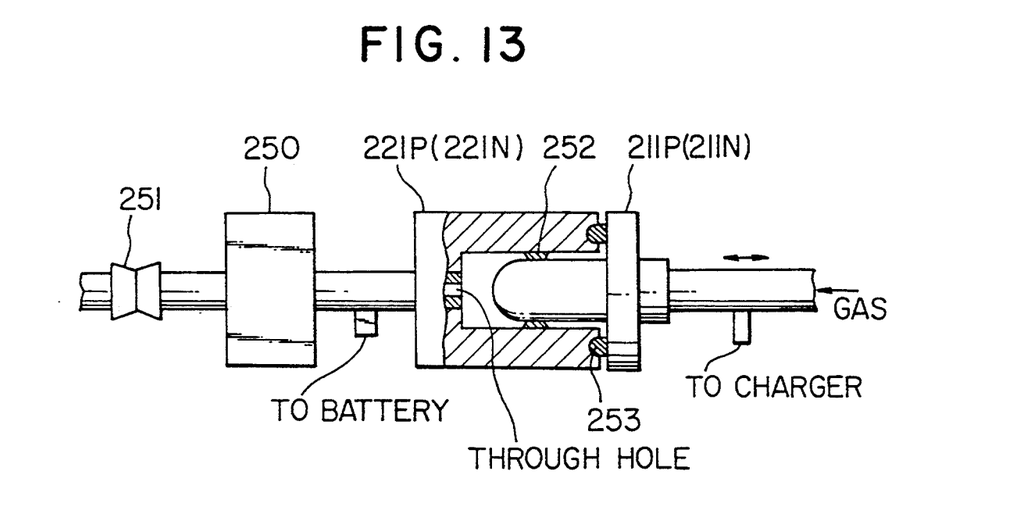
FIG. 13 is a view showing a charging connecter serving as a gas passage coupling.

FOURTH EXAMPLE (FIG. 13)

According to the third example of the second embodiment, the charging connectors are separately provided from the gas passage couplings as illustrated in FIGS. 10 and 11, but the charging connectors 211P and 211N and the other charging connectors 221P and 221N may be hollow inside thereof to form the inert gas passage as illustrated in FIG. 13.

In the third example, a filter 250 and a closing valve 251 are provided at the side of the charging connectors 221P and 221N. Denoted at 252 is a contact point and 253 is a seal member.

According to the third example of the second embodiment of the present invention, the supply time of the nitrogen gas is prescribed by the timer, not shown, in the controller 60. However, the meter for measuring content of the oxygen in the conveying box 40 or the content of the nitrogen is provided and the controller 60 may issue a valve opening instruction when the contents of the oxygen and the nitrogen reaches given contents. The conveying box 40 may have a bottom which is a part of the ceiling 30B of the carriage frame 30A and covers the part of the ceiling 30B.

Although the conveying box 40 is fixed to the carriage frame 30A in the second embodiment, it may not be fixed to the carriage frame 30A but may be transferred to or from the semiconductor manufacturing apparatus 10 and 20.

The loading robot 31 on the unmanned carriage 30 can transfer the wafer cassette 1 to or from the semiconductor manufacturing apparatus 10 and 20 on the ground in the second embodiment, but it may installed on the ground to carry out such loading operation.

Although the coupler unit on the ground is reciprocally moved in the second embodiment, the coupler unit on the carriage may be reciprocally moved. Although the unmanned carriage has the battery mounted thereon, the unmanned carriage having no battery may travel on the rails by way of which the power source is supplied.

According to the second embodiment, when the unmanned carriage reaches the given station, the movable coupler unit of the coupler device on the ground moves toward the unmanned carriage to thereby connect to the coupler unit on the carriage, whereby the gas supply passage in the unmanned carriage is connected to the inert gas reserving source through both the coupler units. When the semiconductor wafer, etc. are accommodated in the conveying box, the air in the conveying box is replaced by the inert gas, which is supplied from the inert gas reserving source, so that the spontaneous oxide film is prevented from growing on the surface of the semiconductor wafer during the conveyance thereof so that the manufacturing yield can be improved compared with the conventional one. Furthermore, inasmuch as the inert gas reserving source is not provided on the unmanned carriage but located on the ground, it is possible to restrain the spontaneous oxide film from growing without rendering the unmanned conveying device to be largescale and heavyweight so that the inert gas reserving source does not cause the unmanned carriage danger even if the unmanned carriage travels recklessly,

What is claimed is:

1. An apparatus for a clean room, comprising: an unmanned conveying device provided with a container for accommodating an object to be conveyed thereon, the container being connected to an inert gas source through a gas supply passage so that the atmosphere in the container can be replaced by a nitrogen gas, wherein the unmanned conveying device has a coupler device with a first coupler unit which is connected to the gas supply passage and the inert gas source is located on the ground and connected to a second coupler unit of a coupler device on the ground through a pipe, the gas supply passage being connected to the inert gas source when the coupler units are releasably coupled to each other, wherein the coupler device on the ground has a reciprocating mechanism for permitting the second coupler unit thereof to reciprocate relative to the first coupler unit of the coupler device on the unmanned conveying device, wherein the second coupler unit on the ground has first connectors electrically coupled to a first circuit disposed in the coupler device on the ground and has a first gas passage coupling which communicates with the inert gas source, wherein the first coupler unit of the coupler device on the unmanned conveying device has second connectors electrically coupled to a second circuit disposed in the unmanned conveying device and engageable with the first connectors and has a second gas passage coupling which communicates with the gas supply passage and is engageable with the first gas passage coupling, and wherein when the first and second coupler units are releasably coupled the gas supply passage communicates with the inert gas source through the first and second gas passage couplings and the first and second circuits are electrically coupled through the first and second connectors.

2. An apparatus according to claim 1 further comprising a timer for measuring a time interval during which the inert gas is supplied to the container, the atmosphere in the container being substantially replaced by the inert gas when the time interval ends.

3. An apparatus according to claim 1, including means for closing the gas supply passage when the content of the oxygen or the inert gas in the container reaches a prescribed value after the gas supply passage is opened.

4. An apparatus according to claim 1, wherein the gas supply passage includes a solenoid valve, and including means for partially closing the solenoid valve so as to supply a small amount of gas therethrough after the atmosphere in the container is substantially completely replaced by the inert gas.

5. An apparatus according to claim 1, wherein the gas supply passage includes a solenoid valve provided with main and auxiliary valves, wherein the main valve is open when the inert gas is being supplied to the container to replace the air therein, and wherein the main valve is closed and the auxiliary valve is open and supplies a small amount of gas to the container after the atmosphere in the container is substantially completely replaced by the inert gas.

6. An unmanned conveying device according to claim 1, wherein the first and second gas passage couplings have means for effecting a check valve function.

7. An apparatus according to claim 1, wherein the first circuit in the coupler device on the ground has a gas passage connection detector which responds to electrical connection between the first connectors on the ground and the second connectors on the unmanned conveying device by issuing a detecting signal, and has a closing valve for permitting the second coupler unit to communicate with the inert gas reservoir, the closing valve being opened upon reception of the detecting signal issued by the gas passage connection detector.

8. An apparatus according to claim 7, wherein the coupler device on the ground has a controller which can effect radio communication between the unmanned conveying device and itself and which can control the reciprocating mechanism and the closing valve based on an instruction issued by the unmanned conveying device.

9. An apparatus according to claim 1, wherein the unmanned conveying device has a battery mounted thereon which can be charged by an automatic charging station on the ground, the second coupler unit of the coupler device on the ground being installed in the automatic charging station, and the first and second connectors of the coupler devices on the ground and the unmanned conveying device having respective charging connectors which are respectively coupled to the automatic charging station and the battery.

10. An apparatus for a clean room, comprising: an unmanned conveying device provided with a container for accommodating an object to be conveyed thereon, the container being connected to an inert gas source through a gas supply passage so that the atmosphere in the container can be replaced by a nitrogen gas, wherein the unmanned conveying device has a coupler device with a first coupler unit which is connected to the gas supply passage and the wherein the inert gas source is located on the ground and connected to a second coupler unit of a coupler device on the ground through a pipe, the gas supply passage being connected to the inert gas source when the coupler units are coupled to each other, wherein the unmanned conveying device has a battery mounted thereon which can be charged by an automatic charging station on the ground, the second coupler unit of the coupler device on the ground being installed in the automatic charging station, and the second and first coupler units of the coupler devices on the ground and the unmanned conveying device having respective charging connectors which are respectively coupled to the automatic charging station and the battery and having respective gas passage couplings which are respectively coupled to the inert gas source and the gas supply passage, including a closing valve which controls flow of the inert gas through the pipe, and wherein the second and first coupler units of the coupler devices on the ground and the unmanned conveying device are provided with coupling verification means which is responsive to a distance between the coupler devices being less than a distance therebetween when the charging connectors and the gas passage couplings thereon first engage each other for issuing an output for controlling the closing valve to facilitate a flow of the inert gas through the pipe.

* * * * *

UNITED STATES PATENT AND TRADEMARK OFFICE
CERTIFICATE OF CORRECTION

PATENT NO. : 5 332 013
DATED : July 26, 1994
INVENTOR(S) : Masanao SUGITA, et al It is certified that error appears in the above-identified patent and that said Letters Patent is hereby corrected as shown below:

On the title page, immediately below the line in the left column which sets forth the filing date, please add the following:

---[30] Foreign Application Priority Data
March 15, 1991 [JP] Japan....3-05985
April 19, 1991 [JP] Japan....3-088064

Signed and Sealed this

Eleventh Day of October, 1994

Attest:

BRUCE LEHMAN

*Attesting Officer*    *Commissioner of Patents and Trademarks*